(12) United States Patent
Yusa et al.

(10) Patent No.: US 12,091,325 B2
(45) Date of Patent: Sep. 17, 2024

(54) HEXAGONAL 6H BARIUM GERMANIUM OXIDE, METHOD FOR PRODUCING SAME, SINTERED BODY, AND TARGET

(71) Applicant: National Institute for Materials Science, Ibaraki (JP)

(72) Inventors: Hitoshi Yusa, Ibaraki (JP); Masashi Miyakawa, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 948 days.

(21) Appl. No.: 17/044,838

(22) PCT Filed: Mar. 4, 2019

(86) PCT No.: PCT/JP2019/008477
§ 371 (c)(1),
(2) Date: Oct. 1, 2020

(87) PCT Pub. No.: WO2019/198384
PCT Pub. Date: Oct. 17, 2019

(65) Prior Publication Data
US 2021/0130185 A1    May 6, 2021

(30) Foreign Application Priority Data
Apr. 12, 2018    (JP) .................. 2018-076475

(51) Int. Cl.
*C01G 17/00*    (2006.01)
*C23C 14/08*    (2006.01)
*C23C 14/34*    (2006.01)

(52) U.S. Cl.
CPC .......... *C01G 17/006* (2013.01); *C23C 14/088* (2013.01); *C23C 14/3407* (2013.01);
(Continued)

(58) Field of Classification Search
CPC ................ C01G 17/006; C23C 14/088; C23C 14/3407; C23C 14/3414; C23C 14/08; C01P 2002/34; C01P 2002/52; C01P 2002/72; C01P 2002/76; C01P 2002/77; C01P 2002/78; C01P 2004/61; C01P 2004/62; C01P 2006/40; C01P 2002/02; C04B 2235/3418; C04B 2235/767;
(Continued)

(56) References Cited

U.S. PATENT DOCUMENTS

2009/0315432 A1\* 12/2009 Furuta .................... C04B 35/01
                                                                    252/62.9 PZ

FOREIGN PATENT DOCUMENTS

JP        2010-006688        1/2010

OTHER PUBLICATIONS

H. Hiramnatsu et. al, Inorg. Chern., 56, 10535-10542, 2017.
H. Yusa et. al, Arn. Mineral., 92, 648-654, 2007.
Y. Shimizu et. al, High Temperature—High Pressures, 2, 113-120, 1970.
Ozima, Mituko et al., Journal of Solid State Chemistry, 1982, 44, pp. 307-317.
(Continued)

*Primary Examiner* — Anthony J Zimmer
*Assistant Examiner* — Syed T Iqbal
(74) *Attorney, Agent, or Firm* — Trojan Law Offices

(57) ABSTRACT

Provided are a barium germanium oxide having a 3-4 eV band gap, a method for producing the same, a sintered body thereof, and a target thereof. The barium germanium oxide includes at least Ba, Ge, and O, includes a crystal represented by a general formula of $ABO_3$ (here, A includes at least Ba and B includes at least Ge), and has a hexagonal 6H-type perovskite structure.

17 Claims, 7 Drawing Sheets

Orthorhombic $BaGeO_3$

High temperature and high pressure processing is carried out in a temperature range of 900 degree Celsius or higher and 2300 degree Celsius or lower in a pressure range of 7.5 GPa or more and 45 GPa or less.

Hexagonal 6H-type $BaGeO_3$

(52) U.S. Cl.
CPC ...... *C23C 14/3414* (2013.01); *C01P 2002/34* (2013.01); *C01P 2002/52* (2013.01); *C01P 2002/72* (2013.01); *C01P 2002/76* (2013.01); *C01P 2002/77* (2013.01); *C01P 2002/78* (2013.01); *C01P 2004/61* (2013.01); *C01P 2004/62* (2013.01); *C01P 2006/40* (2013.01)

(58) Field of Classification Search
CPC .......... C04B 35/645; C04B 2235/3215; C04B 2235/3224; C04B 2235/3225; C04B 2235/3227; C04B 2235/3229; C04B 2235/3286; C04B 2235/3287; C04B 2235/76; C04B 2235/768; C04B 35/01

See application file for complete search history.

(56) References Cited

OTHER PUBLICATIONS

Gura, J. p. Journal of Materials Science, 1979, 14, pp. 1744-1748.
Tobbens, D. M. et al., Acta Crystallographica Section B: Structural Science, 2006, 62,pp. 1002-1009.
"A germanate transparent conductive oxide", Hiroshi Mizoguchi et al., Nature Communications, pp. 1-5.
"Cubic perovskite polymorph o f strontium metasilicate at high pressures", Wansheng Xiae et al., "American Mineralogist," pp. 2096-2104.
Foreign Office Action: CN 201980025044. English translation provided.

* cited by examiner

HEXAGONAL 6H BARIUM GERMANIUM OXIDE, METHOD FOR PRODUCING SAME, SINTERED BODY, AND TARGET

TECHNICAL FIELD

The present invention relates to a barium germanium oxide, a method of manufacturing the same, a sintered body thereof, and a target thereof, and specifically relates to a hexagonal 6H-type (6H) barium germanium oxide, a method of manufacturing the same, a sintered body thereof, and a target thereof.

BACKGROUND ART

In a display of a mobile information terminal such as a smartphone and a tablet, a transparent conductive material is used. Since the transparent conductive material currently used mostly includes as the main component rare metals such as an indium oxide, there is demand in a search for an alternative material in consideration of the resource. For example, Ba (barium) and Si (silicon), and Ge (germanium) belonging to the same group as Si are abundant resources such that it is preferable to develop such a material in which these elements are employed.

An oxide represented by $BaSiO_3$ having a perovskite structure in the cubic system, the rhombohedral (9R) system or the hexagonal (6H) system has been developed (for example, see nonpatent references 1 and 2). According to the nonpatent reference 1, the oxide represented by $BaSiO_3$ in the cubic system could be obtained, but it would become amorphous at the atmospheric pressure such that it could not be utilized as a transparent conductive substance. According to the nonpatent reference 2, the oxides represented by $BaSiO_3$ of 9R type and 6H type could be obtained, but they would become amorphous at the atmospheric pressure such that they could not be utilized.

And an oxide represented by $BaGeO_3$ having a perovskite structure in the hexagonal (9H) system or the hexagonal (6H) system has been developed (for example, see nonpatent reference 3). $BaGeO_3$ of 9H type is synthesized by processing an oxide represented by $BaGeO_3$ having a pseudo-wollastonite structure in a temperature range from 650 degree Celsius to 850 degree Celsius and in a pressure range from 9.5 GPa to 12 GPa. In a similar manner, $BaGeO_3$ of 4H type is synthesized by processing an oxide represented by $BaGeO_3$ having a pseudo-wollastonite structure in a temperature range from 950 degree Celsius to 1400 degree Celsius and in a pressure range from 9.5 GPa to 12 GPa. However, band gaps of these materials have not been reported. And, $BaGeO_3$ in the orthorhombic can be obtained at the atmospheric pressure, but the band gap is as large as 5.7 eV such that it cannot be utilized as the transparent conductive substance.

PRIOR ART REFERENCE

Nonpatent Reference

[Nonpatent Reference 1] H. Hiramatsu et. al, Inorg. Chem., 56, 10535-10542, 2017
[Nonpatent Reference 2] H. Yusa et. al, Am. Mineral., 92, 648-654, 2007
[Nonpatent Reference 3] Y. Shimizu et. al, High Temperature-High Pressures, 2, 113-120, 1970

SUMMARY OF THE INVENTION

Problem to be Solved by the Invention

As mentioned above, an object of the present invention is to provide a barium germanium oxide having a band gap of not exceeding 4 eV, a manufacturing method of the same, a sintered body thereof, and a target made of the same.

Means to Solve the Problem

A barium germanium oxide according to the present invention includes at least Ba (barium), Ge (germanium), and O (oxygen) and includes a crystal represented by a general formula of $ABO_3$ (here, A includes at least Ba and B includes at least Ge) and the crystal represented by said $ABO_3$ may have a hexagonal 6H-type perovskite structure. In this way, the above object may be achieved.

The crystal represented by the $ABO_3$ may have a symmetry of a space group of $P6_3/mmc$ and its lattice constants a, b, and c may satisfy the following formulae, respectively.

$a=0.56006\pm0.05$ (nm), $b=0.56006\pm0.05$ (nm), and $c=1.3653\pm0.1$ (nm).

It may have a band gap in the range of 2.5 eV or more and 4 eV or less.

It may have a band gap in the range of 2.5 eV or more and 3.5 eV or less.

The A may further include an element selected from the group consisting of La (lanthanum), Ce (cerium), Pr (praseodymium), Nd (neodymium), Sm (samarium), Eu (europium), Gd (gadolinium), Tb (terbium), Dy (dysprosium), Ho (holmium), Er (erbium), Tm (thulium), Yb (ytterbium), Lu (lutetium), Y (yttrium), Sc (scandium), and In (indium).

The A may further include the thus-selected element in the range of 0.05 mol % or more and 15 mol % or less.

The B may further include Si.

The method for producing barium germanium oxide according to the present invention may include a step of processing a raw material powder including barium germanium oxide represented by $BaGeO_3$ having at least an orthorhombic crystal system in a temperature range of 900 degree Celsius or higher and 2300 degree Celsius or lower in a pressure range of 7.5 GPa or higher and 45 GPa or lower. In this way, the above object may be achieved.

In the above-mentioned processing step, a high temperature and high pressure processing method or a shock compression method may be carried out with at least one device selected from the group consisting of a diamond anvil cell, a multi-anvil apparatus, and a belt-type high-pressure apparatus In the above-mentioned processing step, the high temperature and high pressure processing method may be carried out with the diamond anvil cell or the multi-anvil apparatus wherein the above-mentioned pressure range may comprise a range of 12 GPa or more and 44 GPa or less before the processing and may comprise a range of 7.5 GPa or more and 40 GPa or less after the processing.

The above-mentioned pressure range may comprise a range of 12 GPa or more and 24 GPa or less before the processing, and may comprise a range of 8.0 GPa or more and 18.5 GPa or less after the processing.

The temperature range may be a range of 1200 degree Celsius or higher and 2000 degree Celsius or lower.

The above-mentioned temperature range may comprise a range of 1300 degree Celsius or higher and 1500 degree Celsius or lower and the above-mentioned pressure range may comprise a range of 19.5 GPa or more and 24 GPa or less before the processing, and may comprise a range of 12.5 GPa or more and 16.5 GPa or less after the processing.

The above-mentioned raw material powder may comprise a powder having a particle diameter of 100 nm or more and 500 μm or less.

In the above-mentioned processing step, the above-mentioned raw material powder may react for at least 5 minutes and for not exceeding 24 hours.

The above-mentioned raw material powder may further include substance including at least one kind of element selected from the group consisting of Y, Sc, In, Si, La, Ce, Pr, Nd, Sm, Eu, Gd, Tb, Dy, Ho, Er, Tm, Yb, and Lu.

It may comprise a sintered body including barium germanium oxide as mentioned above. Such a sintered body may solve the problem as mentioned above.

It may comprise a target for a physical vapor deposition including a sintered body as mentioned above.

Effect of the Invention

The barium germanium oxide as described above may have a 6H-type perovskite structure in the hexagonal system. In this way, the crystal symmetry decreases such that the band gap may decrease as low as 4 eV or less. Such a barium germanium oxide may become a transparent conductive substance with a dopant and defect control.

A method for manufacturing barium germanium oxide as described above may include a step of heat treating a raw material powder including a barium germanium oxide represented by $BaGeO_3$ having an orthorhombic crystal in a temperature range of 900 degree Celsius or higher and 2300 degree Celsius or lower in a pressure range of 7.5 GPa or more and 45 GPa or less. In this way, the obtained product can be a stable barium germanium oxide having a crystal structure that is hardly broken even under one atmosphere.

EMBODIMENT OF CARRYING OUT THE INVENTION

In the following, an embodiment of the present invention will be explained with reference to the drawings. It should be noted that like numerals refer to like elements and explanations thereof will be omitted.

In an embodiment of the present invention, a barium germanium oxide having a hexagonal 6H-type perovskite structure and a manufacturing method thereof will be explained.

Figure 1:
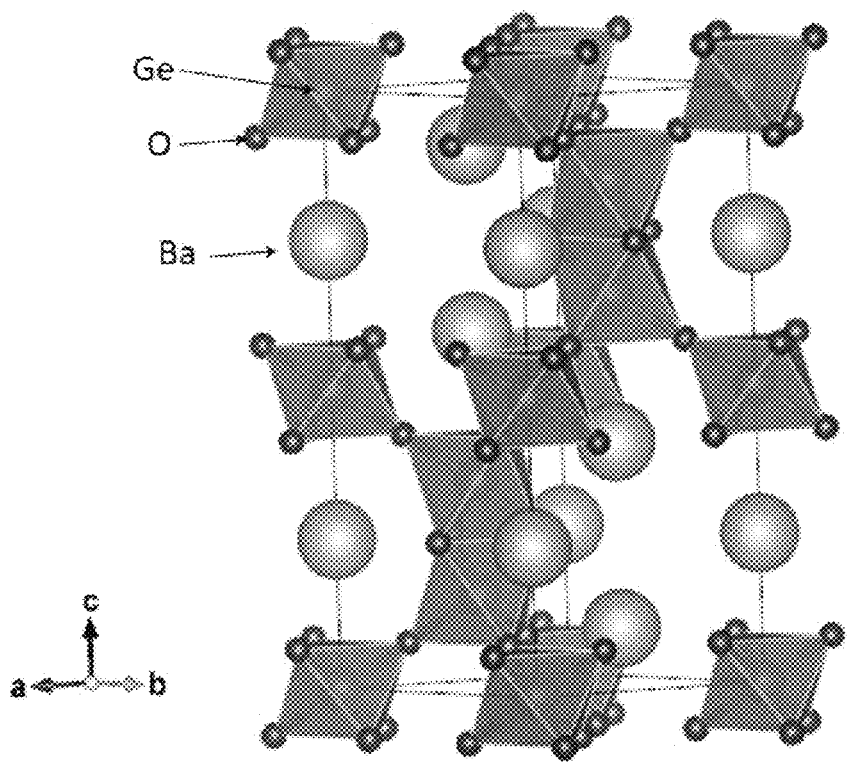
FIG. 1 shows a schematic diagram showing a crystal structure of a barium germanium oxide of the present invention.

FIG. 1 shows a schematic diagram showing a crystal structure of a barium germanium oxide in an embodiment of the present invention.

In an embodiment of the present invention, a barium germanium oxide may include at least Ba (barium), Ge (germanium), and O (oxygen), and may be represented by a general formula of $ABO_3$ (where the A element includes at least Ba and the B element includes at least Ge). Further, with respect to an embodiment of the present invention, in a barium germanium oxide, the crystal represented by $ABO_3$ may have a hexagonal 6H-type perovskite structure. Here, in the present application, with respect to the oxygen in "$ABO_3$", the crystal may include that in an oxygen excessive state or an oxygen deficient state and it can be interpreted in this way with respect to the present specification.

The inventors of the present application have found out a barium germanium oxide having a hexagonal 6H-type perovskite structure that is different from the crystal structure of the existing barium germanium oxide. In this way, the symmetry of the crystal was successfully reduced. As a result, in an embodiment of the present invention, a band gap of the barium germanium oxide was found to be not exceeding 4 eV.

Here, a 6H-type $BaGeO_3$ synthesized by the present inventors was a crystal, in which all of the A elements were Ba and all of the B elements were Ge, wherein the crystal was among the crystals represented by the above-mentioned $ABO_3$ and belonged to the hexagonal system and to the space group $P6_3/mmc$ (space group No. 194 in the International Tables for Crystallography). In Table 1, the crystal parameters and occupancies of the atomic coordinate positions as shown in Table 1. As far as the present inventors know, the 6H-type $BaGeO_3$ having such crystal parameters has not been reported before.

TABLE 1

| Crystal structure parameters of 6H-type $BaGeO_3$ | |
|---|---|
| Crystal composition | 6H-type $BaGeO_3$ |
| Formula weight (Z) | 6 |
| Crystal system | Hexagonal |
| Space group | $P6_3/mmc$ |
| Space group number | No. 194 |

TABLE 1-continued

Crystal structure parameters of 6H-type BaGeO$_3$

| Lattice constants | a | 5.6006 | Å |
|---|---|---|---|
|  | b | 5.6006 | Å |
|  | c | 13.653 | Å |
|  | α | 90 | Degree |
|  | β | 90 | Degree |
|  | γ | 120 | Degree |

Atomic coordinate

| Atom | x | y | z | Site occupancy rate |
|---|---|---|---|---|
| Ba1 | 0 | 0 | 1/4 | 1 |
| Ba2 | 1/3 | 2/3 | 0.0946 | 1 |
| Ge1 | 0 | 0 | 0 | 1 |
| Ge2 | 1/3 | 2/3 | 0.8447 | 1 |
| O1 | 0.5236 | 0.0473 | 1/4 | 1 |
| O2 | 0.835 | 0.67 | 0.0815 | 1 |

In Table 1, lattice constants a, b, and c signify respective lengths of the axes of the unit cell, and α, β, and γ signify respective angles between axes of the unit cell. The atomic coordinates indicate positions of respective atoms in the unit cell.

An analysis was made to obtain such a result that Ba, Ge, and O atoms exist in this crystal, respectively, and that Ba atoms exist in two kinds of sites (Ba1-Ba2), Ge atoms exist in two kinds of sites (Ge1-Ge2), and O atoms exist in two kinds of sites (O1-O2). According to the analysis result utilizing the data summarized in Table 1, it has been found that the 6H-type BaGeO$_3$ has the crystal structure as shown in FIG. 1 where Ba is included in a skeleton of a series of tetrahedron skeletons constituted of bonds between Ge and O.

As a crystal having the same crystal structure as the synthesized 6H-type BaGeO$_3$, there is a crystal represented by ABO$_3$ as mentioned above (The A element may further comprise, other than Ba, at least one kind of element selected from the group consisting of La (lanthanum), Ce (cerium), Pr (praseodymium), Nd (neodymium) in addition to Ba.), Sm (samarium), Eu (europium), Gd (gadolinium), Tb (terbium), Dy (dysprosium), Ho (holmium), Er (erbium), Tm (thulium), Yb (ytterbium), Lu (lutetium), Y (yttrium), Sc (scandium), and In (indium). The B element may further comprise Si other than Ge.). The lattice constants could be changed by including an element other than Ba or Ge as described above. Those having such a crystal structure, sites to be occupied by atoms, and atomic sites given by the coordinates that are essentially unchanged may be considered a barium germanium oxide of an embodiment according to the present invention. Those having the lattice constants that are not changed so much that chemical bonds between atoms constituting the skeleton, although they are changed to some extent, may be considered a barium germanium oxide of an embodiment according to the present invention. In the present invention, both crystal structures may be determined to be identical if lengths of chemical bonds (distance of neighboring atoms) of Ge—O and Ge—Ba calculated from the lattice constants and atomic coordinates obtained by conducting the Rietveld analysis of the results from the X-ray diffraction or the neutron diffraction of the subject substance in the space group of P6$_3$/mmc are compared with lengths of chemical bonds calculated from the lattice constants and atomic coordinates of the crystal as shown in Table 1 such that each difference between corresponding lengths is within ±5%. If the difference between corresponding lengths of the chemical bonds is beyond ±5%, the chemical bonds may be broken such that the crystal may have another crystal structure. As another simple judging method, both crystals may be determined to have the identical crystal structure if major peaks (e.g., approximately ten (10) peaks of the highest intensity) of the X-ray diffraction pattern of the 6H-type BaGeO$_3$ are compared with and determined to substantially match those of the subject substance.

In particular, any of La, Ce, Pr, Nd, Sm, Eu, Gd, Tb, Dy, Ho, Er, Tm, Yb, Lu, Y, Sc, and In, which the A element could include, could be effective as a dopant. Since they may be able to have carriers controlled, they may be advantageously included therein to make the barium germanium oxide a transparent conductive material in an embodiment of the present invention. These dopants may be allowed to be doped within a doping amount where the crystal structure is maintained. By way of example, the doping amount may be in a range of 0.05 mol % or more and 15 mol % or less of the A element sites and, preferably, in a range of 0.05 mol % or more and 10 mol % or less. And, for example, the range may be 0.01 mol % or more or 0.05 mol % or more and 15 mol % or less or 10 mol % or less.

And it is possible to make carrier doping by oxygen deficiency. In this way, it may work as a transparent conductive material. The deficient amount may be in a range of 0.05% or more and 10% or less. Here, the deficient amount can be measured by the thermobalance measurement (TG) in a dry oxygen atmosphere.

Further, the crystal represented by ABO$_3$ may have the symmetry of space group P6$_3$/mmc. And the lattice constants a, b, and c may preferably satisfy $$a = 0.56006 \pm 0.05 (\text{nm}),$$

$$b = 0.56006 \pm 0.05 (\text{nm}), \text{ and}$$

$$c = 1.3653 \pm 0.1 (\text{nm}), \text{ respectively.}$$

Thereby, the crystal in particular may be stable. And this may be able to lower the band gap.

In an embodiment of the present invention, a barium germanium oxide may comprise a crystal represented by the above-mentioned ABO$_3$. And it may comprise the band gap in a range of 2.5 eV or more and 4 eV or less. Further, in more detail, a barium germanium oxide can have the band gap in a range of 2.5 eV or more and 3.5 eV or less in the case where the A element is Ba and the B element is Ge in an embodiment of the present invention. The barium germanium oxide could be utilized as a transparent conductive material if it has such a band gap in an embodiment of the present invention. Further, the band gap in a range of 2.9 eV or more and 3.3 eV or less can be obtained by adjustment of the composition.

Next, in an embodiment of the present invention, an exemplified method of manufacturing a barium germanium oxide is explained.

Figure 2:
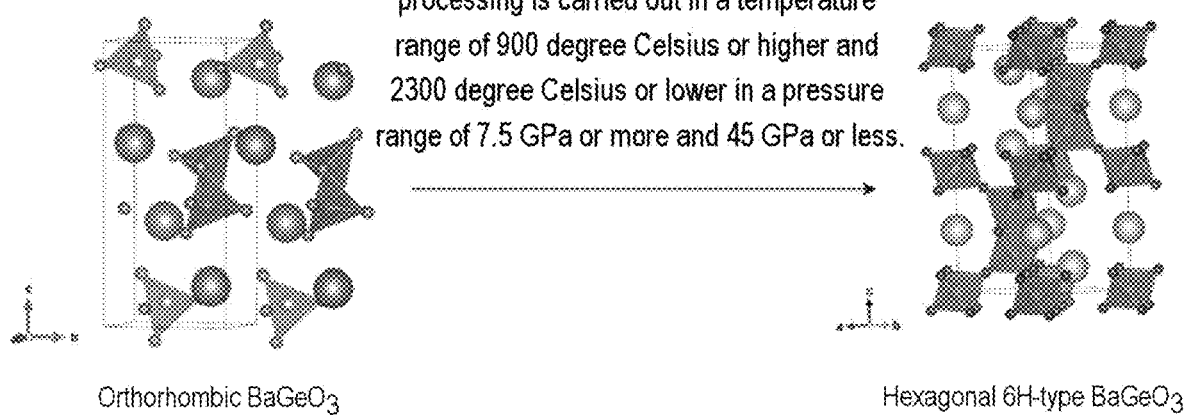
FIG. 2 shows a diagram illustrating a process for manufacturing a barium germanium oxide of the present invention.

FIG. 2 shows a diagram illustrating a process to manufacture a barium germanium oxide in an embodiment of the present application.

In an embodiment of the present invention, a manufacturing method can be exemplified where a raw material powder including a barium germanium oxide represented by BaGeO$_3$ having at least an orthorhombic crystal as the raw material powder is used. In general, the BaGeO$_3$ having the orthorhombic crystal is a barium germanium oxide fired under an atmospheric pressure and an obtainable barium germanium oxide. From this viewpoint, it may be called as a normal pressure phase BaGeO$_3$. The present inventors found out that a barium germanium oxide having a 6H-type perovskite structure in the above-mentioned hexagonal crystal system can be manufactured by conducting a high temperature and high pressure processing (hereinafter, simply referred to as "process" or "processing") in a temperature range of 900 degree Celsius or higher and 2300 degree Celsius or lower and in a pressure range of 7.5 GPa or more and 45 GPa or less of a raw material powder including at least the normal pressure phase $BaGeO_3$. It is likely that a low-pressure type barium germanium oxide tends to be manufactured by the process in a temperature of lower than 900 degree Celsius and in a pressure of less than 7.5 GPa. It is likely that a product obtained by the process in a temperature of higher than 2300 degree Celsius and in a pressure of more than 45 GPa tends to become amorphous after leaving the product in an ordinary temperature and under one atmospheric pressure. Here, in the present specification, the low-pressure type barium germanium oxide can mean an oxide including tetra-coordinated $GeO_4$ in the structure. For example, a diploid phase of $BaGe_2O_5$ and $Ba_3GeO_4$ can be included such an oxide.

Here, differences between a manufacturing method of a 4H-type $BaGeO_3$ described in the above-mentioned non-patent reference 3 and a manufacturing method in an embodiment of the present invention will be described. The method of the nonpatent reference 3 in which $BaGeO_3$ having a pseudo-wollastonite structure is used as a raw material is different from that of the present invention with respect to the point that the present inventors use a normal pressure phase $BaGeO_3$ as a raw material. The present inventors found out that the crystal structure of the product would not be broken even at an ordinary temperature and under one atmospheric pressure by using the normal pressure phase $BaGeO_3$ and satisfying the above-mentioned condition. In this way, it was found that a barium germanium oxide having a hexagonal 6H-type perovskite structure could be manufactured in a stable manner.

Here, the raw material powder is preferably a powder having a particle diameter in a range of 100 nm or larger and 500 μm or smaller. Thereby, the reaction can be further promoted. Preferably, it can be a powder having a particle diameter in a range of 200 nm or larger and 200 μm or smaller. Here, in the present specification, the particle diameter is made to be a volume-based median diameter (d50) which may be measured by a Microtrac or a laser light scattering method.

The raw material powder may further include substance including at least one kind of element selected from the group consisting of Y, Sc, In, Si, La, Ce, Pr, Nd, Sm, Eu, Gd, Tb, Dy, Ho, Er, Tm, Yb, and Lu. Thereby, a crystal represented by $ABO_3$ (The A element may further include, in addition to Ba, at least one kind of element selected from the group consisting of La, Ce, Pr, Nd, Sm, Eu, Gd, Tb, Dy, Ho, Er, Tm, Yb, Lu, Y, Sc, and In. The B element may further include Si in addition to Ge.) can be obtained. Here, the amount to be added may be in such a range that the crystal structure identical to the crystal structure as shown in Table 1 can be sustained. For example, in the case where Si is added thereto, as substance including Si, a normal pressure phase $BaSiO_3$ and/or metallic Si may be employed.

The substance including at least one kind of element selected from the group consisting of Y, Sc, In, Si, La, Ce, Pr, Nd, Sm, Eu, Gd, Tb, Dy, Ho, Er, Tm, Yb, and Lu may be a single metal, an oxide, a carbonate, and the like of any of these. Further, in addition to these additive substances, a germanium oxide powder may be added thereto for adjusting the composition.

Here, a period of time for the high temperature and high pressure processing may vary depending on the amount of the raw material and the device to be used, but it may be in a range of 5 minutes or longer and 24 hours or shorter, for example.

The above-mentioned processing, for example, may be conducted by the high temperature and high pressure processing method or the shock compression method using at least one kind of device selected from the group consisting of a diamond anvil cell, a multi-anvil apparatus, and a belt-type high-pressure apparatus. In these methods, the above-mentioned temperature ranges and pressure ranges can be achieved. The device which can achieve the above-mentioned high temperature and high pressure may be used. Here, it is not necessary to use limitedly the above-mentioned devices.

Here, the case where the raw material powder is processed by the diamond anvil cell device where it is filled in the diamond anvil cell will be explained.

Figure 3:
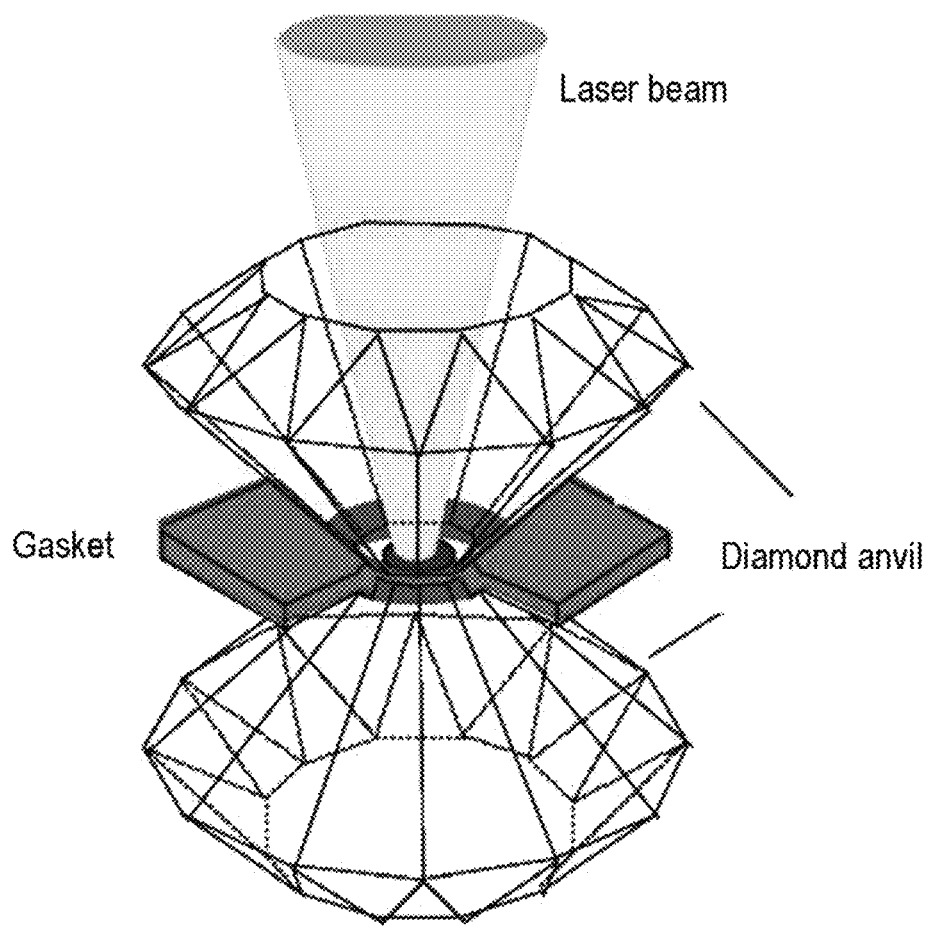
FIG. 3 shows a schematic diagram showing a whole diamond anvil device having a diamond anvil cell.

FIG. 3 shows a schematic diagram showing a whole diamond anvil cell device having a diamond anvil cell.

Figure 4:
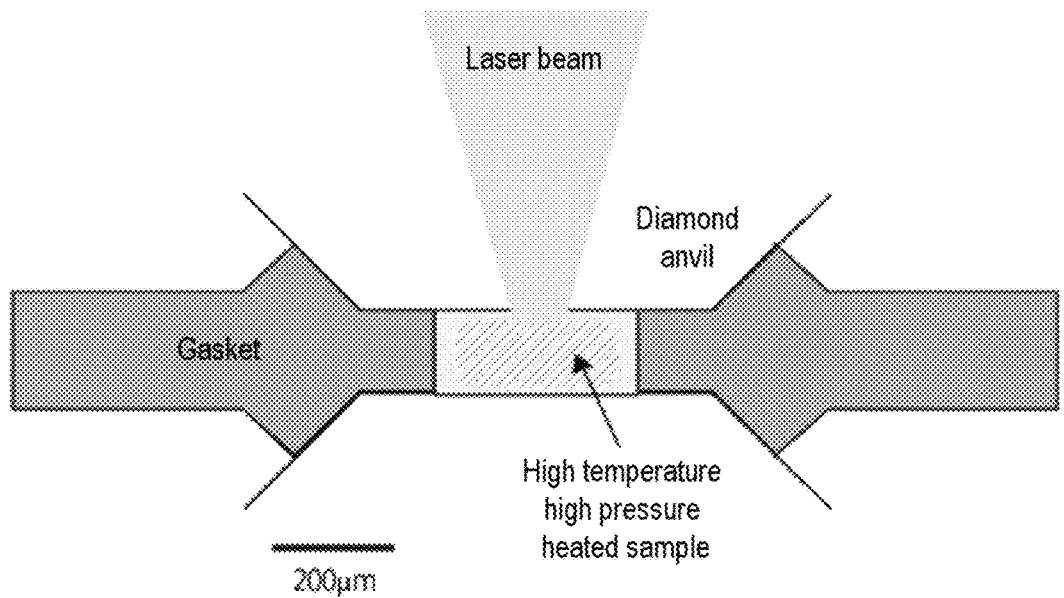
FIG. 4 shows a schematic diagram showing details of the diamond anvil device of FIG. 3.

FIG. 4 shows a schematic diagram showing details of the diamond anvil cell device of FIG. 3.

As the diamond anvil cell device, an existing device can be used and, as shown in FIG. 3, diamonds having respective bottom faces ground flat are set such that the bottom faces are positioned in an opposed manner such that the pressure is applied to the bottom faces. As shown in FIG. 4, the raw material powder including the normal pressure phase $BaGeO_3$ is held by a gasket and the diamond.

Next, the above-mentioned pressure may be applied to the diamond anvil cell device and the raw material powder may be irradiated with a laser beam such as a fiber laser. The heating temperature may be determined from the color temperature and the irradiation time of the laser may be from several minutes to several tens minutes after the temperature becomes constant.

In the case where the above-mentioned processing is conducted by the high temperature and high pressure processing method using the diamond anvil cell device or the multi-anvil apparatus as shown on FIGS. 3 and 4, the pressure range preferably may be a range of 12 GPa or more and 44 GPa or less before the processing, and satisfy a range of 7.5 GPa or more and 40 GPa or less after the processing. In an embodiment of the present invention, it is known that the pressure before heating (before processing) is quite different from the pressure after heating (after processing) and a barium germanium oxide having the above-mentioned hexagonal 6H-type perovskite structure can be manufactured by adjusting the pressures such that the above-mentioned ranges may be satisfied. More preferably, the pressure ranges may be a range of 12 GPa or more and 24 GPa or less before the processing and satisfy a range of 8 GPa or more and 18.5 GPa or less after the processing. It is possible to adjust the pressure before the heating and the pressure after the heating such that the above-mentioned ranges may be satisfied. Thereby, the barium germanium oxide having the above-mentioned hexagonal 6H-type perovskite structure can be manufactured in single phase.

Further, in the case where the above-mentioned processing is conducted by the high temperature and high pressure processing method using the diamond anvil cell device or the multi-anvil apparatus as shown in FIGS. 3 and 4, the temperature range preferably may be a temperature range of 1200 degree Celsius or higher and 2000 degree Celsius or lower. In this range, the barium germanium oxide having the above-mentioned hexagonal 6H-type perovskite structure can be manufactured. More preferably, the temperature range may be a range of 1300 degree Celsius or higher and 1500 degree Celsius or lower. And the pressure range may be a range of 19.5 GPa or more and 24 GPa or less before the processing. And after the processing, a range of 12.5 GPa or more and the 16.5 GPa or less may be satisfied. Such condition can be selected. Thereby, the barium germanium oxide having the above-referenced hexagonal 6H-type perovskite structure can be manufactured in single phase with high yield.

Next, the explanation will be made with respect to the case where the processing by the belt-type high-pressure apparatus using a high-pressure cell having a capsule in which the raw material powder is filled.

Figure 5:
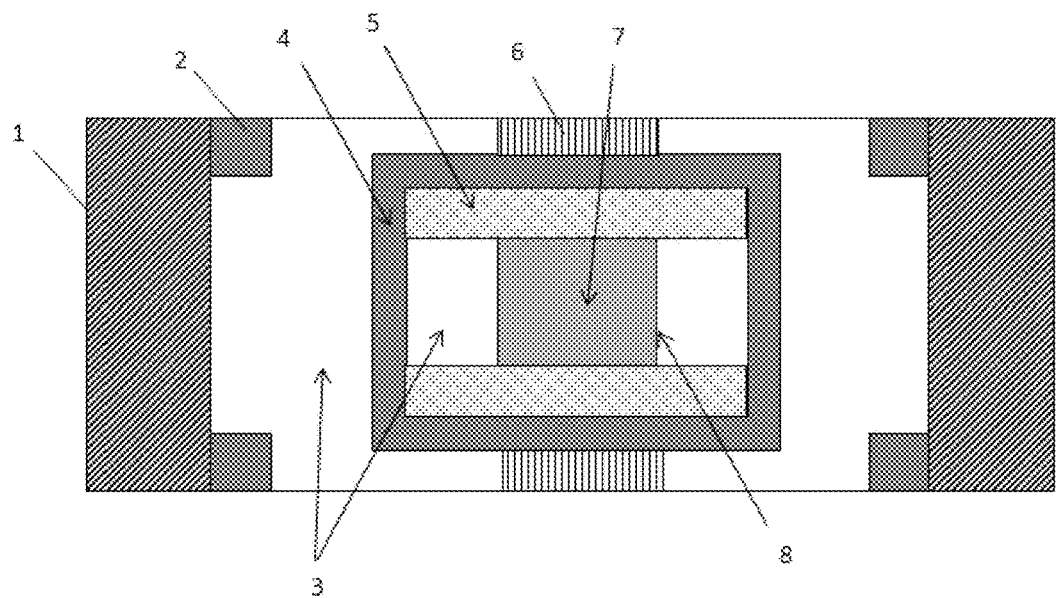
FIG. 5 shows a schematic diagram showing a cross section of a high-pressure cell including a capsule to be used for manufacturing a barium germanium oxide of the present application.

FIG. 5 shows a diagram showing schematically a cross section of the high-pressure cell having the capsule to be used for manufacturing a barium germanium oxide of the present invention.

The high-pressure cell comprises a pyrophyllite 1 in a cylindrical shape; two steel rings 2 arranged in a contact manner with an inner wall of the cylindrical shape on the upper side and on the lower side; a carbon heater 4 in a cylindrical shape arranged on the center axis side of the steel rings 2; a metallic capsule 8 arranged inside the carbon heater 4; and a raw material powder 7 filled inside the metallic capsule 8. A powder 3 for filling is filled in a clearance between the pyrophyllite 1 and the carbon heater 4 and a powder 3 for filling is also filled in a clearance between the carbon heater 4 and the metallic capsule 8. A metallic electrode 6 made of Mo or the like is arranged on the carbon heater 4. FIG. 5 shows a state where a powder 7 of the normal pressure phase $BaGeO_3$ is filled in the metallic capsule 8.

After an inner bottom part of the carbon heater 4 of the cylindrical shape having one end side closed by a lid of a disk shape is covered with a powder 5 for filling, the metallic capsule 8 is arranged inside the carbon heater 4 of the cylindrical shape in a coaxial manner, a powder 3 for filling is filled in a clearance between the metallic capsule 8 and the inner wall face of the carbon heater 4, the top of the metallic capsule 8 is further covered with a powder 5 for filling, and then the other end side is sealed with a lid of a disk shape.

After the carbon heater 4 of the cylindrical shape is arranged inside the pyrophyllite 1 of the cylindrical shape in a coaxial manner, a powder 3 for filling is filled in a clearance between the carbon heater 4 and the inner wall face of the pyrophyllite 1. As the powders 3 and 5 for filling, for example, NaCl+10 wt % $ZrO_2$ can be employed.

Next, while the steel ring 2 is pushed thereinto so as to be embedded in the powder 3 for filling on the upper side of the inner wall face of the pyrophyllite 1, another steel ring is also pushed thereinto so as to be embedded in the powder 3 for filling on the lower side of the inner wall face of the pyrophyllite 1. In the aforementioned way, the high-pressure cell in which the raw material powder 7 is filled in the metallic capsule 8 is obtained.

Figure 6:
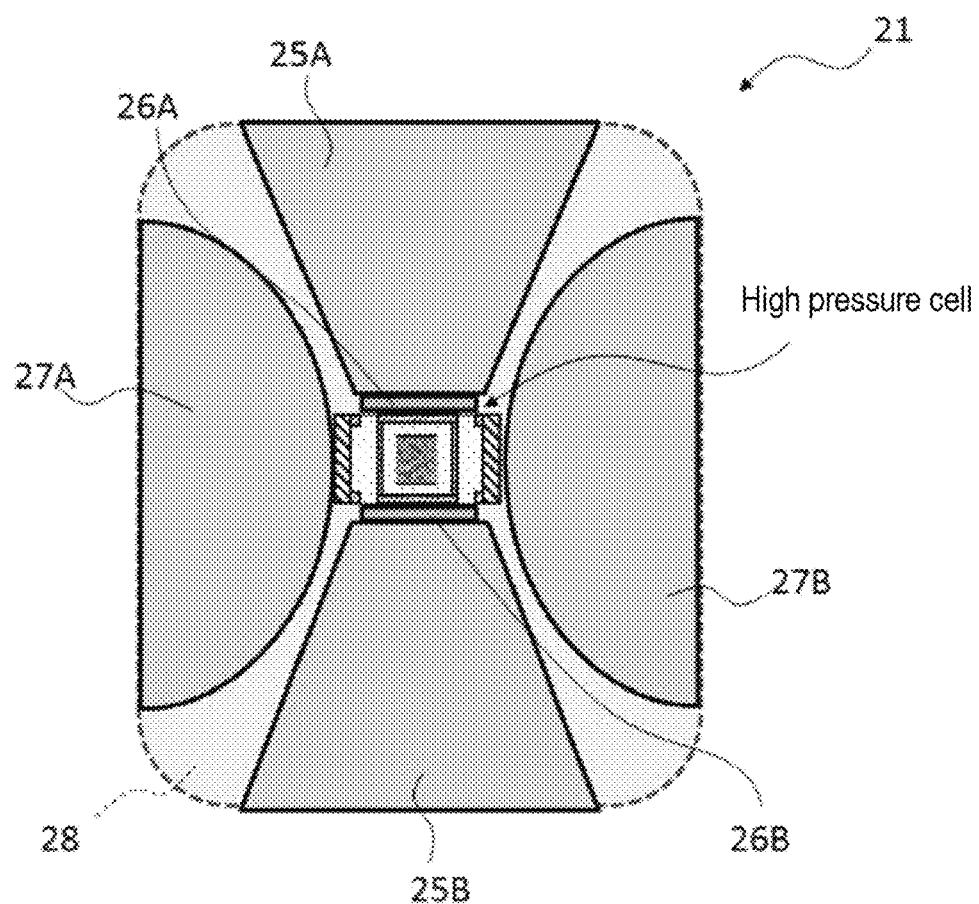
FIG. 6 shows a schematic diagram of a belt-type high-pressure apparatus to be used for manufacturing a barium germanium oxide of the present application.

FIG. 6 shows a diagram showing schematically a belt-type high-pressure apparatus to be used for manufacturing a barium germanium oxide of the present invention.

A high-pressure cell having been set forth with reference to FIG. 5 is arranged in a predetermined position between anvils 25A and 25B, the predetermined position being located between cylinders 27A and 27B of the belt-type high-pressure apparatus, in a contact manner with electric conductors 26A and 26B comprising thin metal plates. Next, a pyrophyllite 28 is then filled between these parts and the high-pressure cell.

The high-pressure cell is pressurized by moving the anvils 25A and 25B and the cylinders 27A and 27B to the high-pressure cell side such that the above-mentioned condition may be satisfied. In a state where it is pressurized, it may be heated and held for a predetermined time such that the above-mentioned condition may be satisfied. For example, in the case where the belt-type high-pressure apparatus 21 is used, a barium germanium oxide having the above-mentioned hexagonal 6H-type perovskite structure can be manufactured by the processing in a temperature range of 1100 degree Celsius or higher and 1300 degree Celsius or lower in a pressure range of 9 GPa or more and 10 GPa or less.

So far, a barium germanium oxide of the present invention has been explained as a solidified body or a powder obtained therefrom, but the barium germanium oxide of the present invention could be a powder, a sintered body, a thin film, and so on, and may appear in any form. For example, a powder barium germanium oxide having been obtained by the above-mentioned method can be formed in a shape and sintered such that a sintered body can be obtained. For sintering, a hot-press method, a cold isostatic pressing method (CIP), a hot isostatic pressing method (HIP), or a pulse electric current sintering method may be employed. If the sintered body obtained in this way is used for a target in a physical vapor deposition, a barium germanium oxide thin film of the present invention can be provided.

Next, the present invention will be described in detail using specific examples, but, it should be noted that the present invention is not limited to these examples.

EMBODIMENT

Examples 1-18

In Examples 1-18, a barium germanium oxide represented by $BaGeO_3$ having an orthorhombic crystal (hereinafter, referred to as "orthorhombic $BaGeO_3$") was used as the raw material powder and processed in the pressure range and temperature range as shown in Table 2 by the high temperature and high pressure processing method using laser heating with the diamond anvil cell device as shown in FIGS. 3 and 4.

First, the orthorhombic $BaGeO_3$ powder as the raw material powder was synthesized as follows. A $GeO_2$ powder (manufactured by Aldrich Company, a purity of 99.99%) and a $BaCO_3$ (manufactured by Aldrich Company, a purity of 99.99%) were weighed such that the molar ratio thereof might be 1:1, and then mixed in a corundum mortar. The mixed powder was compacted so as to be shaped in a pellet form (diameter: 10 mm and thickness: 5 mm). This pellet was place in an electric furnace and fired in the atmosphere at 1200 degree Celsius for 8 hours. The fired pellet was crushed again in a corundum mortar and shaped in a pellet form such that it was fired in the same condition. The fired body was identified by conducting the powder X-ray diffraction (XRD). The crystal structure parameters match those of Pearson's Crystal Data #1827134 such that it was confirmed that the obtained sintered body was the orthorhombic $BaGeO_3$.

As shown in FIG. 4, the orthorhombic $BaGeO_3$ powder as the raw material powder was held by the gasket and the diamond. Here, the filled orthorhombic $BaGeO_3$ powder had a particle diameter of about 100 μm and weighed about 0.3 to 0.8 μg.

Next, as shown in Table 2, the pressure before processing (before heating) was applied with respect to the diamond anvil cell device and then the raw material powder was irradiated with a laser beam from a fiber laser of 100 W. Here, the laser beam was condensed in a spot of 10 μmφ and scanned the whole raw material powder, thereby keeping it within the temperature range as shown in Table 2. Here, the heating temperature was determined by the color temperature. The irradiation time of the laser was several minutes (5 minutes to 10 minutes) after the temperature became constant. And the pressure after processing (after heating) was so controlled as to be the pressure as shown in Table 2. Here, the pressure value was measured by the Raman scattering spectrum of the diamond anvil and the X-ray diffraction line of gold mixed with the sample in the case of the DAC high pressure observation experiment, and in the case of the DAC recovery experiment, the pressure value was measured by only the Raman scattering spectrum of the diamond anvil such that the latter pressure value was corrected with reference to the pressure measurement results of the former pressure measurement.

Figure 7:
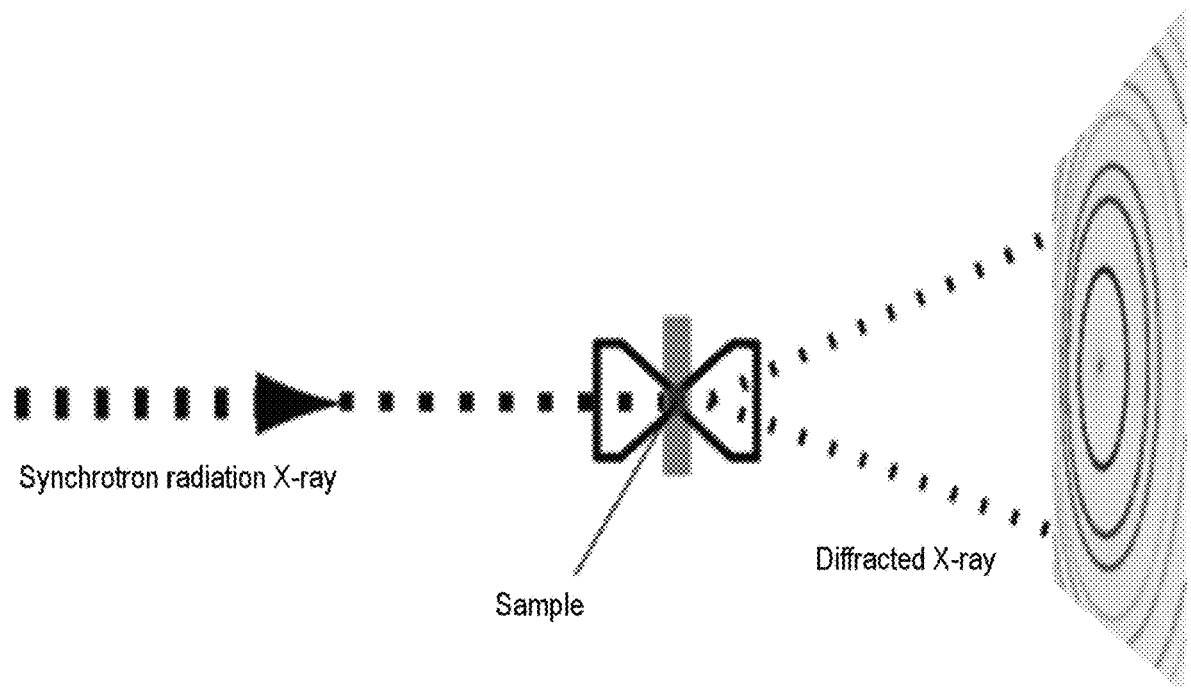
FIG. 7 shows a diagram showing a measurement system for an X-ray structural analysis.

FIG. 7 shows a diagram showing a measurement system for the X-ray structural analysis.

With respect to the sample after the processing, as shown in FIG. 7, the X-ray structural analysis was conducted using the diamond anvil cell itself as the measurement system cell without reducing the pressure. An X-ray from the synchrotron radiation was made monochromatic by silicon (λ=0.041476 nm or 0.033242 nm or 0.074996 nm) such that an X-ray diffraction pattern was obtained. An X-ray structural analysis was performed from the obtained X-ray diffraction pattern such that the crystal parameters such as lattice constants were obtained. The result is shown in Table 3.

Figure 8:
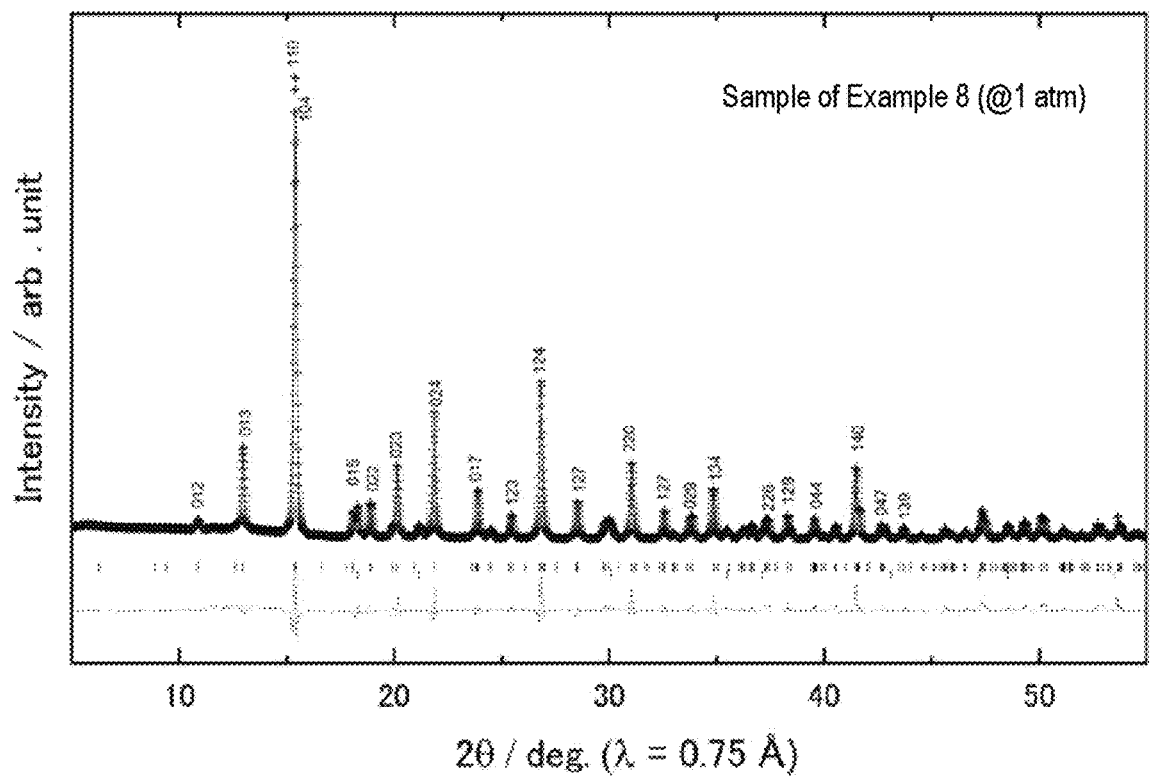
FIG. 8 shows a diagram showing an XRD pattern of a sample of Example 8 (@ 1 atm).

Next, with respect to the sample after the processing, the pressure of the diamond anvil cell was reduced one atmosphere such that the sample was taken out of the cell, the X-ray structural analysis was performed, and the crystal parameters such as lattice constants were obtained. The results are shown in FIG. 8 and Table 3.

Figure 14:
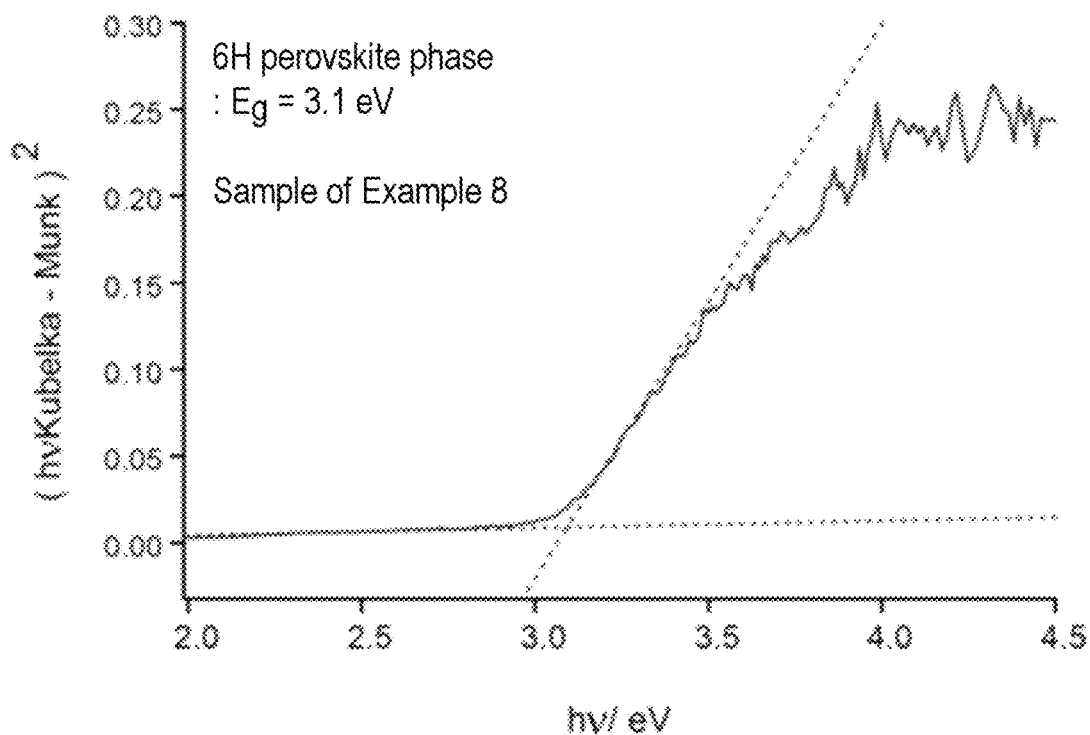
FIG. 14 shows a diagram showing a diffuse reflectance spectrum of a sample of Example 8.

Further, with respect to the sample after the processing, a diffuse reflectance spectrum was measured using a diffuse reflectance measuring device. The result is shown in FIG. 14.

Example 19

With respect to Example 19, the orthorhombic BaGeO$_3$ powder was used as the raw material powder and the high temperature and high pressure processing method was carried out in the pressure range and temperature range shown in Table 2 using the belt-type high-pressure apparatus shown in FIGS. 5 and 6.

The orthorhombic BaGeO$_3$ powder synthesized in Example 1 was filled in a cylindrical metallic capsule made of Au (gold) (8 in FIG. 5) having one end side closed with a disk-shaped lid and then the other side of the capsule was sealed with a disk-shaped lid made of Mo. The bulk density at the time of filling was 1.4 g/cm$^3$ at this time. Next, after the powder for filling (NaCl+10 wt % ZrO$_2$) was spread over the inner bottom part of the cylindrical carbon heater (4 in FIG. 5) having one end side closed with a lid, this metallic capsule was arranged in the cylindrical carbon heater in a coaxial manner and the powder for filling (NaCl+10 wt % ZrO$_2$) was filled in a clearance between the metallic capsule and the inner wall face of the carbon heater, and then the other end side was sealed with a disk-shaped lid.

Next, after the cylindrical carbon heater was arranged in the cylindrical pyrophyllite in a coaxial manner, the powder for filling (NaCl+10 wt % ZrO$_2$) was filled in a clearance between the carbon heater and the inner wall face of the pyrophyllite.

Next, the steel ring was pushed into the powder for filling on the upper side of the inner wall face of the pyrophyllite and the other steel ring was also pushed into the powder for filling on the lower side of the inner wall face of the pyrophyllite. In the aforementioned way, the high-pressure cell was made.

The high-pressure cell was arranged in a predetermined position of the belt-type pressurization apparatus as shown in FIG. 6. Each high-pressure cell was pressurized up to the corresponding pressure value shown in Table 2. Next, it was heated at the corresponding temperature shown in Table 2 in a pressurized state. In this state, the temperature and the pressure were kept for 30 minutes. In this way, the raw material powder was processed under the high temperature and high pressure.

After returning to the room temperature and normal pressure, the product was taken out from the inside of the metallic capsule. Next, the product was processed in water heated at 80 degree Celsius. Thus, NaCl attached to the product was dissolved and removed. In this way, the sample was obtained. With respect to the obtained sample, the X-ray structural analysis was performed and the diffuse reflectance spectrum was measured in a similar manner to that of Examples 1 to 18. The result is shown in Table 3.

Examples 20-21

With respect to Examples 20-21, the orthorhombic BaGeO$_3$ powder (powder synthesized in Example 1), La$_2$O$_3$ powder (manufactured by Aldrich Company, a purity of 99.99%), and GeO$_2$ powder (manufactured by Aldrich Company, a purity of 99.99%) were used as the raw material powder, and the high temperature and high pressure processing method by laser heating was carried out in the pressure range and temperature range shown in Table 2 using the diamond anvil cell device shown in FIGS. 3 and 4.

In detail, the orthorhombic BaGeO$_3$ powder, the La$_2$O$_3$ powder, and the GeO$_2$ powder were mixed such that the amounts of metal ions match in the formula represented by Ba$_{1-x}$La$_x$GeO$_3$ (x=0.05, 0.10). As shown in FIG. 4, the mixed powder was held by the gasket and the diamond. Here, the weight of the mixed powder filled therein was about 0.3 to 0.8 μg. The subsequent steps are omitted since they are similar to those of Examples 1 to 18.

With respect to the sample after the processing, the pressure of the diamond anvil cell was reduced to one atmosphere, the sample was taken out of the cell, the X-ray structural analysis was conducted, and the crystal parameters such as lattice constants were obtained. The results are shown in FIG. 8 and Table 3.

TABLE 2

List of experimental conditions of Examples 1 to 21

| Example | Pressure before heating (GPa) | Pressure after heating (GPa) | Heating temperature (° C.) | Device |
|---|---|---|---|---|
| 1 | 39.4 | 33.8 | 2000 | DAC |
| 2 | 12 | 8.1 | 2000 | DAC |
| 3 | 43.1 | 39.6 | 1800 | DAC |
| 4 | 53.7 | 48.4 | 1800 | DAC |

TABLE 2-continued

List of experimental conditions of Examples 1 to 21

| Example | Pressure before heating (GPa) | Pressure after heating (GPa) | Heating temperature (° C.) | Device |
|---|---|---|---|---|
| 5 | 35.3 | 30.8 | 1500 | DAC |
| 6 | 9.9 | 7.7 | 1500 | DAC |
| 7 | 51.4 | 47.2 | 1500 | DAC |
| 8 | 22.5 | 16 | 1500 | DAC |
| 9 | 19.9 | 12.5 | 1500 | DAC |
| 10 | 30.3 | 23.5 | 1500 | DAC |
| 11 | 23.1 | 18.1 | 1500 | DAC |
| 12 | 19.5 | 14.5 | 1500 | DAC |
| 13 | 34.6 | 27.8 | 1300 | DAC |
| 14 | 23.8 | 16.3 | 1300 | DAC |
| 15 | 7.3 | 5.5 | 1200 | DAC |
| 16 | 6.4 | 5.6 | 1200 | DAC |
| 17 | 15.1 | 8.5 | 1200 | DAC |
| 18 | 7.2 | 5.8 | 1200 | DAC |
| 19 | 10 | — | 1200 | Belt-type |
| 20 | 25.6 | 18.8 | 2000 | DAC |
| 21 | 24.2 | 16.9 | 2000 | DAC |

The aforementioned results are explained with reference to Table 3 and FIGS. 8 to 14.

FIG. 8 shows a diagram showing an XRD pattern of the sample of Example 8 (@ 1 atm).

Figure 9:
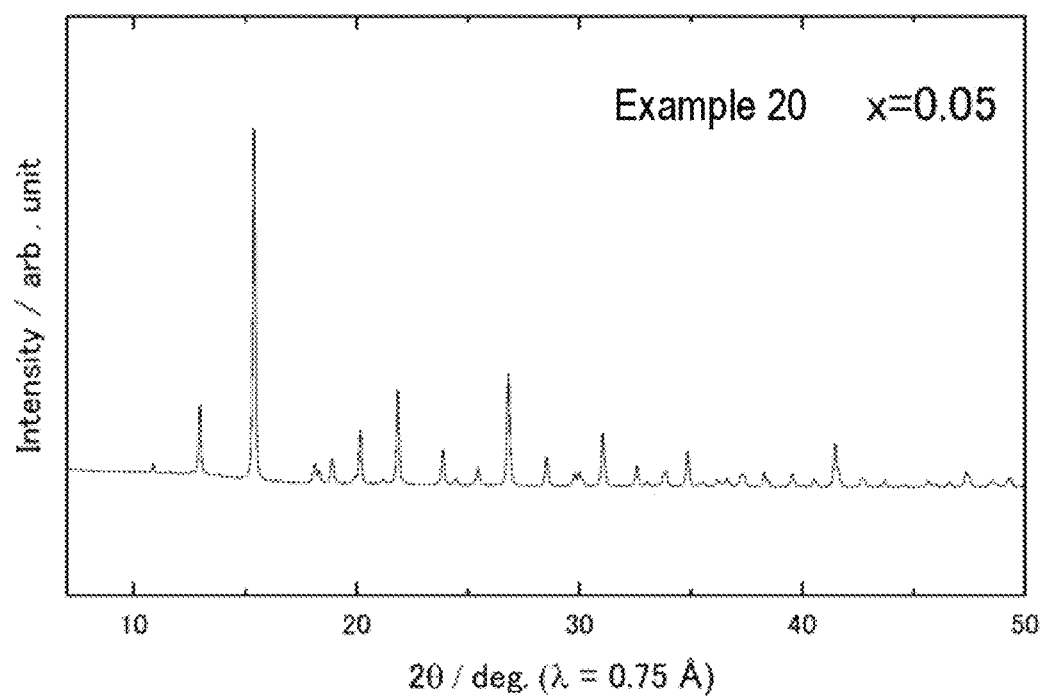
FIG. 9 shows a diagram showing an XRD pattern of a sample of Example 9 (@ 1 atm).

FIG. 9 shows a diagram showing an XRD pattern of the sample of Example 9 (@ 1 atm).

Figure 10:
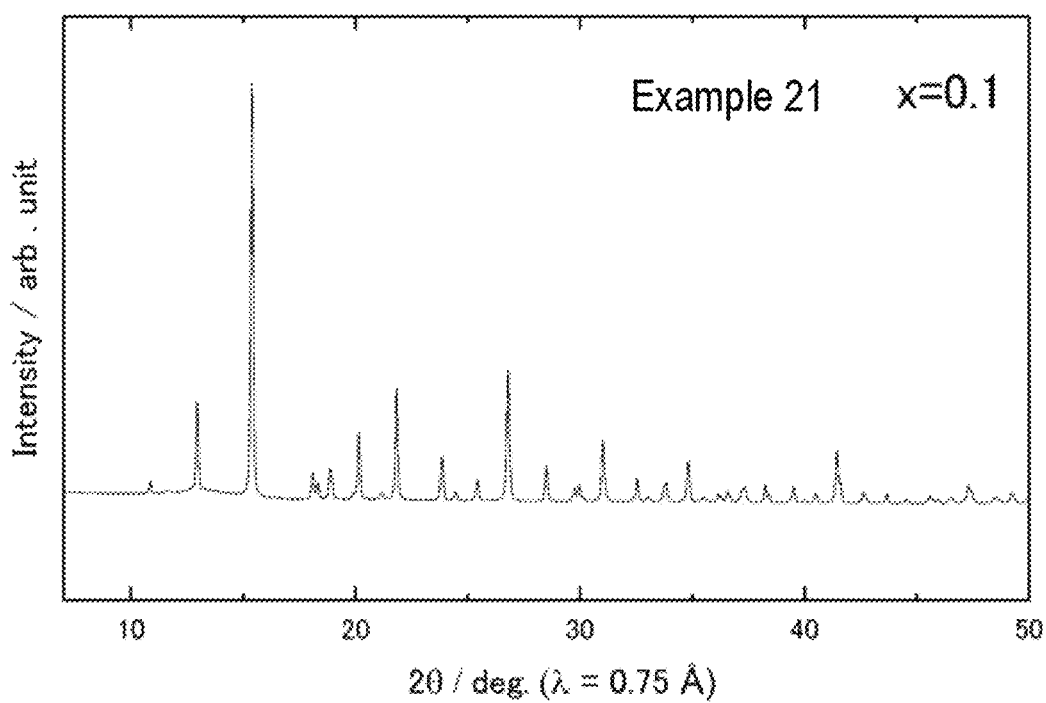
FIG. 10 shows a diagram showing an XRD pattern of a sample of Example 21 (@ 1 atm).

FIG. 10 shows a diagram showing an XRD pattern of a sample of Example 21 (@ 1 atm).

According to FIG. 8, every diffraction peak could be indexed to that of the barium germanium oxide (6H-type $BaGeO_3$) having the perovskite structure showing the symmetry of the hexagonal 6H-type $P6_3/mmc$ space group. With respect to FIGS. 9 and 10, every diffraction peak also could be indexed to that of the barium germanium oxide (6H-type $BaGeO_3$) having the perovskite structure showing the symmetry of the hexagonal 6H-type $P6_3/mmc$ space group. And, no peaks showing any secondary phase other than this were observed. Although not shown in the figures, similar XRD patterns were observed for the samples of Examples 2, 9, 11, 12, 14, 17, and 19.

And, with respect to Examples 1, 3, 5, 10, and 13, similar XRD patterns to that of Example 8 were observed as well as broad halo patterns were also observed. From this, it was found that these samples included an amorphous phase as well as the 6H-type $BaGeO_3$. With respect to the sample of Example 6, a plurality of diffraction peaks were observed such that some were indexed to those of the 6H-type $BaGeO_3$ and some were indexed to those of the low pressure type $BaGeO_3$ With respect to the samples of Examples 4, 7, 15, 16, and 18, no peaks corresponding to those of the 6H-type $BaGeO_3$ were observed.

The above-described results are summarized in Table 3.

TABLE 3

List of product phases of samples of Examples 1 to 21

| Example | High pressure phase | Recovered sample phase |
|---|---|---|
| 1 | — | Amorphous + 6H |
| 2 | 6H $BaGeO_3$ | 6H $BaGeO_3$ |
| 3 | — | Amorphous + 6H |
| 4 | — | Amorphous |
| 5 | — | Amorphous + 6H |
| 6 | — | Low pressure type + 6H |
| 7 | — | Amorphous |
| 8 | — | 6H $BaGeO_3$ |
| 9 | — | 6H $BaGeO_3$ |
| 10 | — | Amorphous + 6H |
| 11 | 6H $BaGeO_3$ | 6H $BaGeO_3$ |
| 12 | 6H $BaGeO_3$ | 6H $BaGeO_3$ |
| 13 | — | Amorphous + 6H |
| 14 | 6H $BaGeO_3$ | 6H $BaGeO_3$ |
| 15 | — | Low pressure type $BaGeO_3$ |
| 16 | — | Low pressure type $BaGeO_3$ |
| 17 | 6H $BaGeO_3$ | 6H $BaGeO_3$ |
| 18 | Low pressure type $BaGeO_3$ | Low pressure type $BaGeO_3$ |
| 19 | — | 6H $BaGeO_3$ |
| 20 | — | 6H $BaGeO_3$ |
| 21 | — | 6H $BaGeO_3$ |

From this, it was shown that at least 6H-type $BaGe_3$ could be manufactured by using the orthorhombic $BaGe_3$ powder as the raw material powder and processing it in the temperature range of 900 degree Celsius or higher and 2300 degree Celsius or lower in the pressure range of 7.5 GPa or more and 45 GPa or less.

Figure 11:
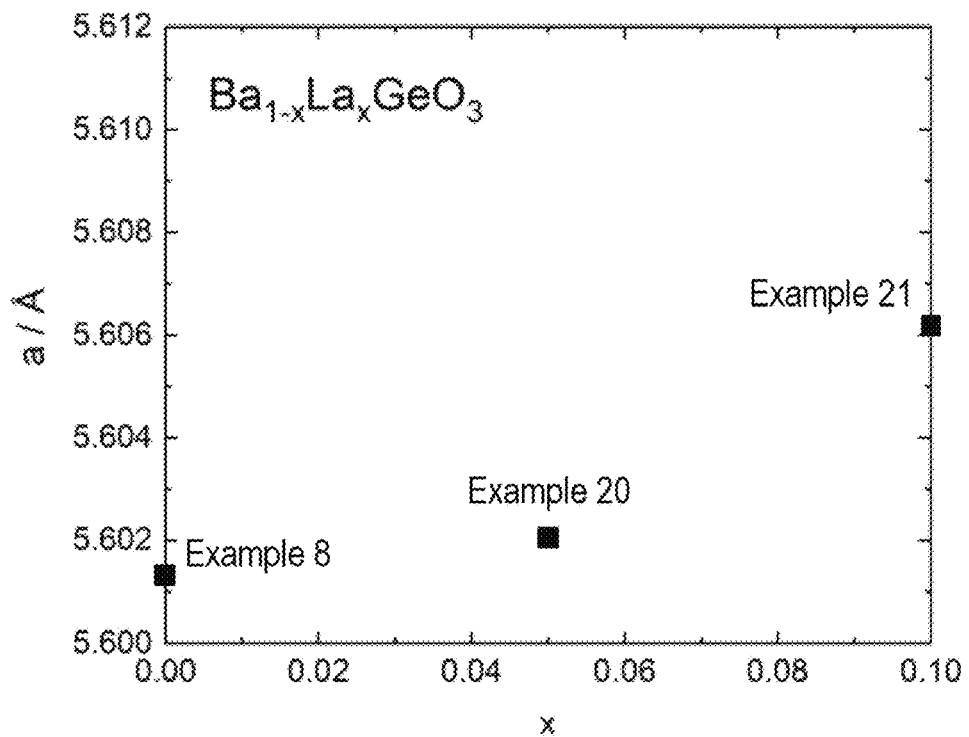
FIG. 11 shows a diagram showing La addition amount dependence of unit lattice length of a-axis with respect to samples of Examples 8, 20, and 21.

FIG. 11 shows a diagram showing La addition amount dependence of unit lattice length of a-axis with respect to samples of Examples 8, 20, and 21.

Figure 12:
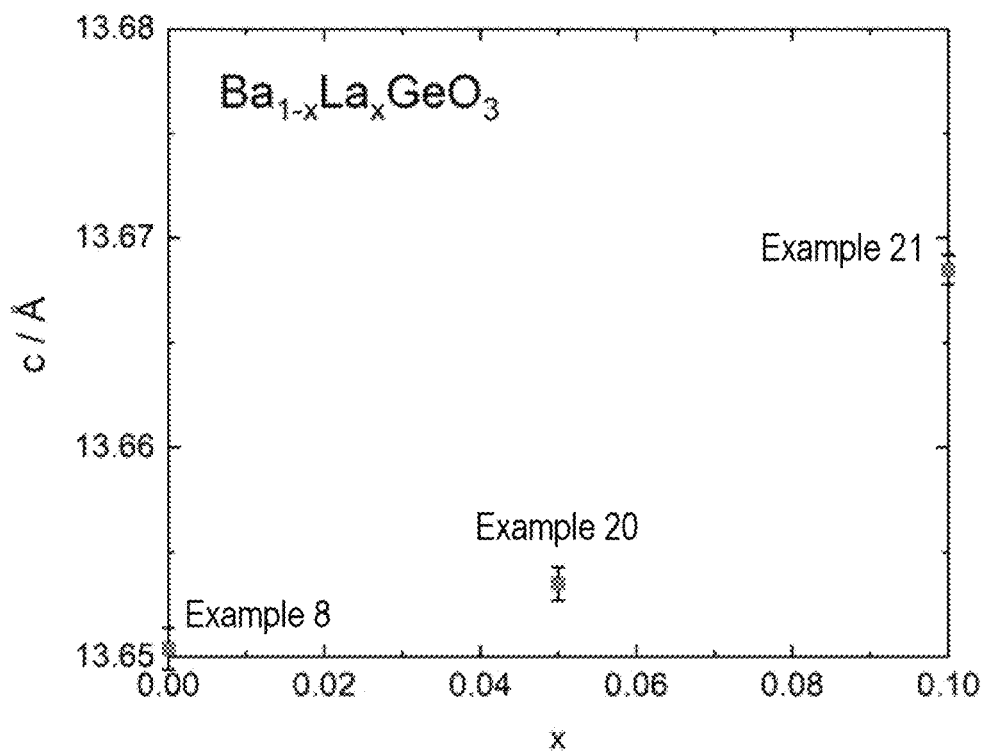
FIG. 12 shows a diagram showing La addition amount dependence of unit lattice length of c-axis with respect to samples of Examples 8, 20, and 21.

FIG. 12 shows a diagram showing La addition amount dependence of unit lattice length of c-axis with respect to samples of Examples 8, 20, and 21.

Figure 13:
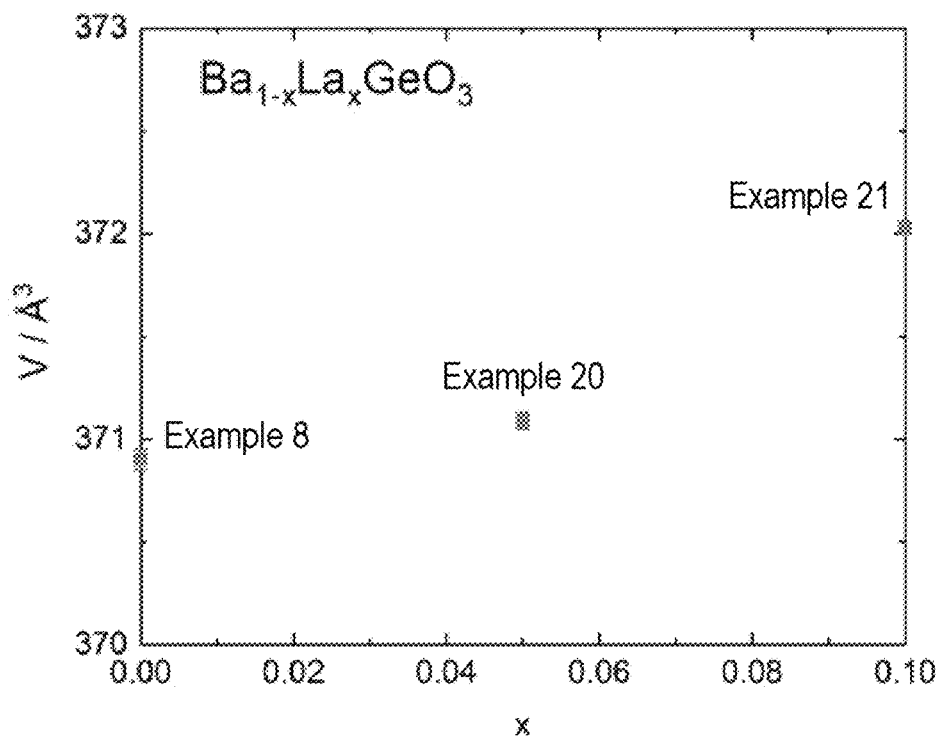
FIG. 13 shows a diagram showing La addition amount dependence of unit cell volume with respect to samples of Examples 8, 20, and 21.

FIG. 13 shows a diagram showing La addition amount dependence of unit cell volume with respect to samples of Examples 8, 20, and 21.

In FIGS. 11 to 13, the result of Example 8 to which La was not added is also shown. From FIGS. 11 to 13, it has been found that, as the addition amount of La increases, the lattice constants of a-axis and c-axis increase. And, as the addition amount of La increases, the cell volume increases. From this, it was found that the added La was solid-solved into the Ba site and that it was suitable to set the upper limit of the addition amount thereof 15 mol %.

And, it has been shown that the 6H-type $BaGeO_3$ in which part of Ba or part of Ge is replaced is manufactured by adding substance including at least one kind of element selected from the group consisting of Y, Sc, In, Si, La, Ce, Pr, Nd, Sm, Eu, Gd, Tb, Dy, Ho, Er, Tm, Yb, and Lu, in addition to the orthorhombic $BaGeO_3$ powder, as the raw material powder. And, it has been shown that the further addition of $GeO_2$ is effective in order to adjust the composition.

FIG. 14 shows a diagram showing a diffuse reflectance spectrum of the sample of Example 8.

As shown in FIG. 14, the band gap ($E_g$) obtained from an absorption edge of the diffuse reflectance spectrum was calculated to be 3.1 eV. Here, although not shown in the figures, all the band gaps of the samples of Examples 2, 9, 11, 12, 14, 17, 19, 20, and 21 were in the range of 2.5 eV or more and 2.5 eV or less.

INDUSTRIAL APPLICABILITY

Since a barium germanium oxide of the present invention has a band gap of 4 eV or less, it can be a transparent electric conductive substance by the dopant and defect control. And, if the barium germanium oxide of the present invention is made a sintered body, which is used for the target, a thin film barium germanium oxide can be provided and applied to a display or the like.

EXPLANATION OF NUMERALS 1 pyrophyllite container (cylindrical shape)
2 steel ring
3, 5 powder for filling (NaCl+10 wt % $ZrO_2$)
4 carbon heater
6 Mo electrode
7 raw material powder
8 metallic capsule
21 belt-type high-pressure apparatus
25A, 25B anvil
26A, 26B electric conductor
27A, 27B cylinder
28 pyrophyllite (for filling)

What is claimed is:

1. A barium germanium oxide comprising:
a crystal represented by a general formula of $ABO_3$ wherein A includes at least Ba and B includes at least Ge; and
a band gap in a range of 2.5 eV or more and 4 eV or less;
wherein the crystal represented by $ABO_3$ has a hexagonal 6H perovskite structure.

2. The barium germanium oxide according to claim 1, wherein the crystal represented by $ABO_3$ has a symmetry of space group $P6_3/mmc$, and the lattice constants a, b, and c satisfy
a=0.56006±0.05 (nm),
b=0.56006±0.05 (nm), and
c=1.3653±0.1 (nm), respectively.

3. The barium germanium oxide according to claim 1, comprising:
the band gap in a range of 2.5 eV or more and 3.5 eV or less.

4. The barium germanium oxide according to claim 1, wherein the A further comprises at least one kind of element selected from a group consisting of La (lanthanum), Ce (cerium), Pr (praseodymium), Nd (neodymium), Sm (samarium), Eu (europium), Gd (gadolinium), Tb (terbium), Dy (dysprosium), Ho (holmium), Er (erbium), Tm (thulium), Yb (ytterbium), Lu (lutetium), Y (yttrium), Sc (scandium), and In (indium).

5. The barium germanium oxide according to claim 4, wherein the at least one kind of element further included in the A comprises in a range of 0.05 mol % or more and 15 mol % or less.

6. The barium germanium oxide according to claim 1, wherein the B further comprises Si.

7. A method of manufacturing a barium germanium oxide as defined in claim 1 comprising the step of:
processing a raw material powder comprising a barium germanium oxide represented by $BaGeO_3$ having at least an orthorhombic crystal in a temperature range of 900 degree Celsius or higher and 2300 degree Celsius or lower in a pressure range of 7.5 GPa or more and 45 GPa or less.

8. The method according to claim 7, wherein the step of processing is carried out by a high temperature and high pressure processing method satisfying the temperature range and the pressure range or a shock compression method using at least one kind of device selected from a group consisting of a diamond anvil cell device, a multi-anvil apparatus, and a belt-type high-pressure apparatus.

9. The method according to claim 8, wherein the step of processing is carried out by the high temperature and high pressure processing method using the diamond anvil cell device or the multi-anvil apparatus,
the pressure range comprises a range of 12 GPa or more and 44 GPa or less before processing and a range of 7.5 GPa or more and 40 GPa or less after processing.

10. The method according to claim 9, wherein the pressure range comprises a range of 12 GPa or more and 24 GPa or less before processing and a range of 8.0 GPa or more and 18.5 GPa or less after processing.

11. The method according to claim 10, wherein the temperature range comprises a range of 1200 degree Celsius or higher and 2000 degree Celsius or lower.

12. The method according to claim 11, wherein the temperature range comprises a range of 1300 degree Celsius or higher and 1500 degree Celsius or lower,
the pressure range comprises a range of 19.5 GPa or more and 24 GPa or less before processing and a range of 12.5 GPa or more and 16.5 GPa or less after processing.

13. The method according to claim 7, wherein the raw material powder comprises a powder having a particle diameter of 100 nm or larger and 500 µm or smaller.

14. The method according to claim 7, wherein the step of processing comprises reacting the raw material powder for a period of 5 minutes or longer and 24 hours or shorter.

15. The method according to claim 7, wherein the raw material powder further comprises substance comprising at least one kind of element selected from a group consisting of Y, Sc, In, Si, La, Ce, Pr, Nd, Sm, Eu, Gd, Tb, Dy, Ho, Er, Tm, Yb, and Lu.

16. A sintered body comprising: a barium germanium oxide as recited in claim 1.

17. A target for a physical vapor deposition comprising: a sintered body as recited in claim 16.

* * * * *